US012610873B2

(12) United States Patent
Yu et al.

(10) Patent No.: US 12,610,873 B2
(45) **Date of Patent: \*Apr. 21, 2026**

(54) INTEGRATED CIRCUIT PACKAGE AND METHOD

(71) Applicant: Taiwan Semiconductor Manufacturing Co., Ltd., Hsinchu (TW)

(72) Inventors: Chen-Hua Yu, Hsinchu (TW); Chi-Hui Lai, Taichung City (TW); Tin-Hao Kuo, Hsinchu (TW); Hao-Yi Tsai, Hsinchu (TW); Chung-Shi Liu, Hsinchu (TW)

(73) Assignee: TAIWAN SEMICONDUCTOR MANUFACTURING CO., LTD., Hsinchu (TW)

( \* ) Notice: Subject to any disclaimer, the term of this patent is extended or adjusted under 35 U.S.C. 154(b) by 0 days.

This patent is subject to a terminal disclaimer.

(21) Appl. No.: 18/767,600

(22) Filed: Jul. 9, 2024

(65) Prior Publication Data

US 2024/0363591 A1 Oct. 31, 2024

Related U.S. Application Data

(60) Continuation of application No. 17/874,598, filed on Jul. 27, 2022, now Pat. No. 12,074,143, which is a
(Continued)

(51) Int. Cl.
*H01L 25/065* (2023.01)
*H01L 21/56* (2006.01)
(Continued)

(52) U.S. Cl.
CPC .......... *H01L 25/0657* (2013.01); *H01L 21/56* (2013.01); *H01L 23/3114* (2013.01); *H01L 23/367* (2013.01); *H01L 23/4006* (2013.01)

(58) Field of Classification Search
CPC ......... H01L 23/4006; H01L 2023/4081; H01L 2023/4043; H01L 23/4012; H01L 2023/4087
See application file for complete search history.

(56) References Cited

U.S. PATENT DOCUMENTS

| | | | |
|---|---|---|---|
| 2020/0203301 A1* | 6/2020 | Yu | H01L 23/49822 |
| 2021/0225719 A1* | 7/2021 | Seler | H01L 21/4817 |
| 2022/0037228 A1* | 2/2022 | Lai | H01L 24/16 |

\* cited by examiner

*Primary Examiner* — Yu-Hsi D Sun
(74) *Attorney, Agent, or Firm* — Slater Matsil, LLP

(57) ABSTRACT

An embodiment includes a first package component including a first integrated circuit die and a first encapsulant at least partially surrounding the first integrated circuit die. The device also includes a redistribution structure on the first encapsulant and coupled to the first integrated circuit die. The device also includes a first thermal module coupled to the first integrated circuit die. The device also includes a second package component bonded to the first package component, the second package component including a power module attached to the first package component, the power module including active devices. The device also includes a second thermal module coupled to the power module. The device also includes a mechanical brace extending from a top surface of the second thermal module to a bottom surface of the first thermal module, the mechanical brace physically contacting the first thermal module and the second thermal module.

20 Claims, 28 Drawing Sheets

Related U.S. Application Data division of application No. 16/900,589, filed on Jun. 12, 2020, now Pat. No. 11,417,633.

(60) Provisional application No. 62/941,328, filed on Nov. 27, 2019.

(51) Int. Cl.
| | | |
|---|---|---|
| *H01L 23/31* | (2006.01) | |
| *H01L 23/367* | (2006.01) | |
| *H01L 23/40* | (2006.01) | |

142
140
136

220
222

100C

INTEGRATED CIRCUIT PACKAGE AND METHOD

PRIORITY CLAIM AND CROSS-REFERENCE

This application is a continuation of U.S. patent application Ser. No. 17/874,598, filed Jul. 27, 2022, entitled "Integrated Circuit Package and Method," which is a divisional of U.S. patent application Ser. No. 16/900,589, filed Jun. 12, 2020, entitled "Integrated Circuit Package and Method," now U.S. Pat. No. 11,417,633, issued Aug. 16, 2022, which claims the benefit of U.S. Provisional Application No. 62/941,328, filed on Nov. 27, 2019, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is package-on-package (POP) technology. In a POP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
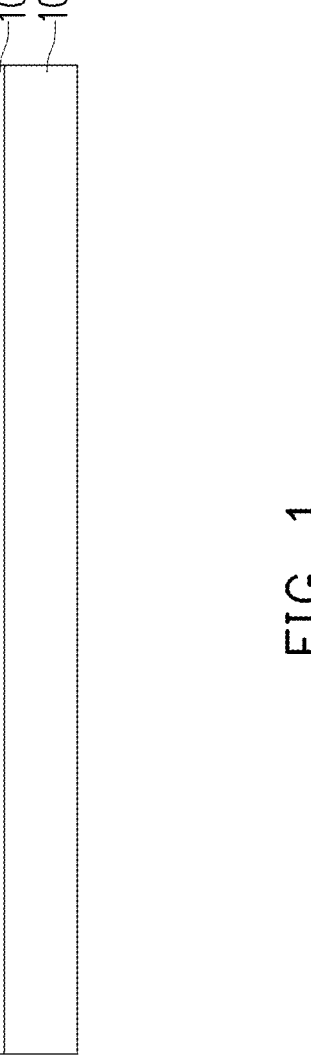
FIGS. 1-19 illustrate cross-sectional views of intermediate steps during a process for forming a package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While embodiments are described in detail below, a general description of the present disclosure is provided herein. In a general sense, the embodiments described herein provide for a package where a mechanical brace including compression parts are used to achieve enhanced thermal interface material (TIM) pressure in a thermal management system. For example, in high power systems, the thermal cooling requirement can require high pressures (>30 psi) on the TIM to reduce thermal resistance for thermal cooling. These high power systems may be used in high performance computing (HPC), edge computing, cloud computing, data centers, networking, and artificial intelligence.

Advantageous features of some or all of the embodiments described herein may include the prevention of damage and cost to the InFO (integrated fan-out) wafer from wafer hole drilling and screwing processes, which may increase the reliability of the package post thermal cycling. Further, the disclosed packages can have thermal management systems integrated with a server chassis.

Figure 23:
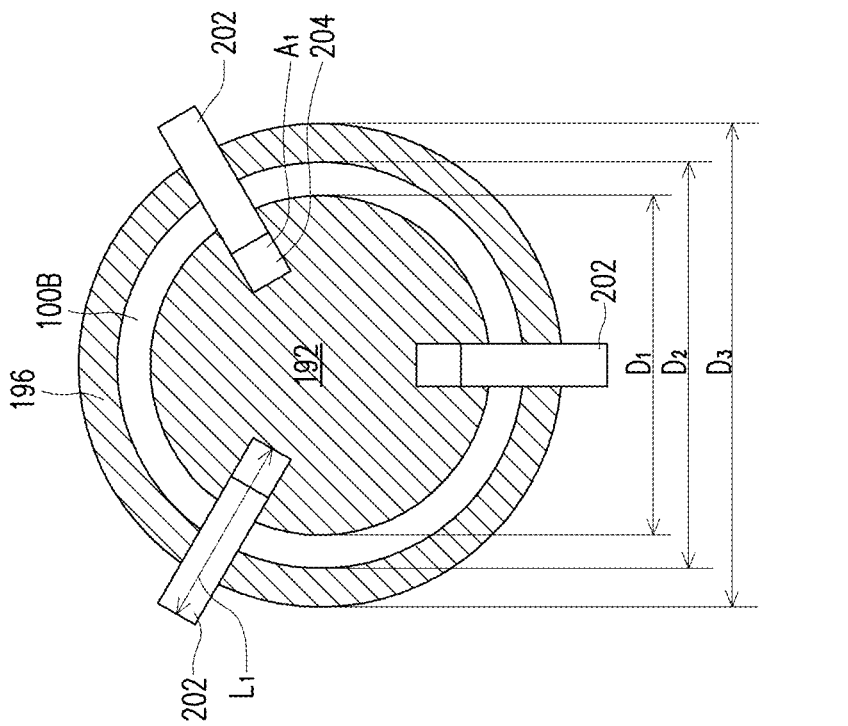
FIGS. 23, 24, and 27 illustrate top-down views of packaged devices, in accordance with some embodiments.
Figure 24:
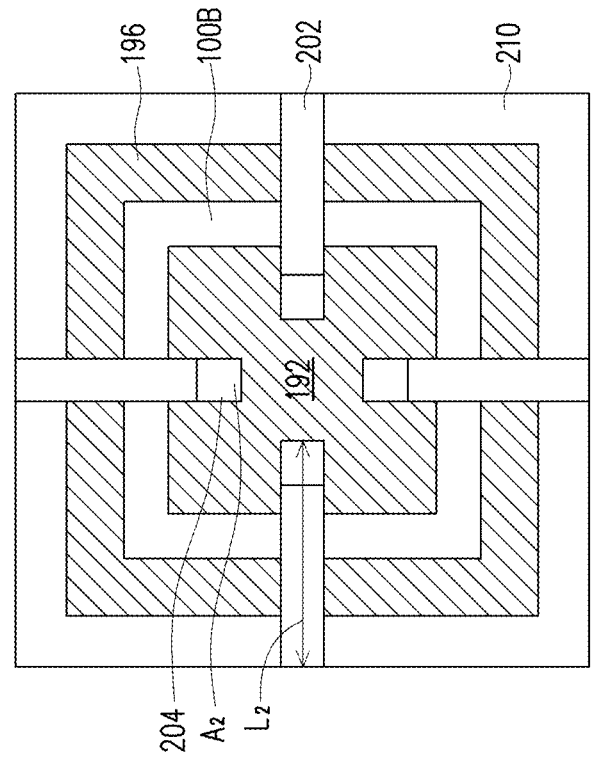

FIGS. 1-16 illustrate cross-sectional views of intermediate steps during a process for forming a package, in accordance with some embodiments. FIGS. 17-22 and 25-26 illustrate cross-sectional views of intermediate steps during a process for forming packaged devices, in accordance with some embodiments. FIGS. 23, 24, and 27 illustrate top-down views of packaged devices, in accordance with some embodiments.

FIGS. 1 through 16 illustrate cross-sectional views of intermediate steps during a process for forming package 100A, in accordance with some embodiments. In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV light. The release layer 104 may be dispensed as a liquid and cured, may be a laminate film laminated onto the carrier substrate 102, or may be the like. A top surface of the release layer 104 may be leveled and may have a high degree of planarity.

Figure 2:
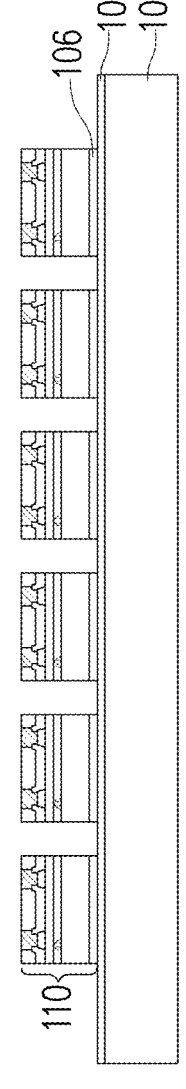

In FIG. 2, dies 110 (sometimes referred to as integrated circuit dies 110) are adhered to the release layer 104 by an adhesive 106. Although six dies 110 are illustrated as being adhered, it should be appreciated that more or less dies 110 may be adhered to the release layer 104. For example, two or three dies 110 may be adhered to the release layer 104. In some embodiments, the dies 110 are integrated circuit dies and may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. In some embodiments, the dies 110 may be passive devices, such as integrated passive devices (IPDs) or discrete passive devices. Also, in some embodiments, the dies 110 may be different sizes (e.g., different heights and/or surface areas), and in other embodiments, the dies 110 may be the same size (e.g., same heights and/or surface areas). The dies 110 are described in greater detail below with respect to FIG. 3.

In some embodiments, a back-side redistribution structure may be formed on the release layer 104 before the dies 110 are adhered such that the dies 110 are adhered to the back-side redistribution structure. In an embodiment, a back-side redistribution structure includes a one or more dielectric layers with one or more metallization patterns (sometimes referred to as redistribution layers or redistribution lines) within those dielectric layers. In some embodiments, a dielectric layer without metallization patterns is formed on the release layer 104 before the dies 110 are adhered to the dielectric layer.

Figure 3:
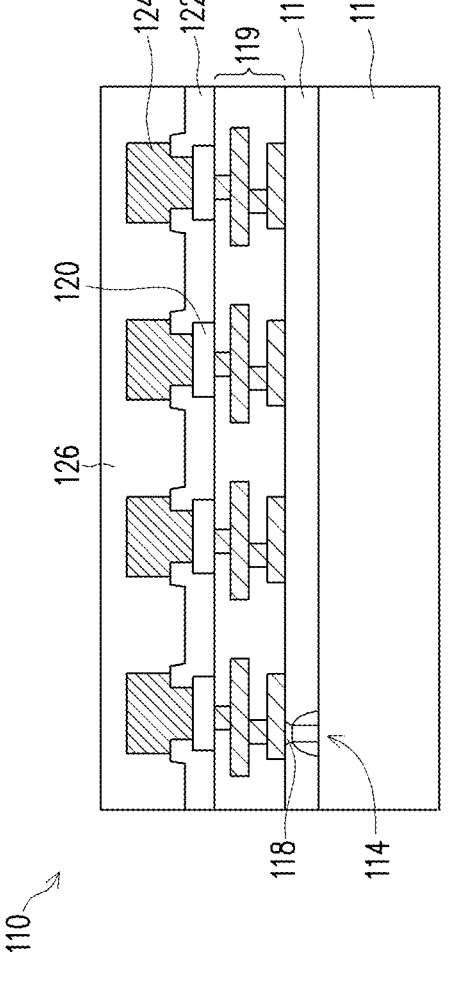

FIG. 3 illustrates one of the dies 110 in accordance with some embodiments. The die 110 will be packaged in subsequent processing to form an integrated circuit package. The die 110 may be formed in a wafer, which may include different device regions that are singulated in subsequent steps to form a plurality of active device dies. The die 110 may be processed according to applicable manufacturing processes to form integrated circuits. For example, the die 110 includes a semiconductor substrate 112, such as silicon, doped or undoped, or an active layer of a semiconductor-on-insulator (SOI) substrate. The semiconductor substrate 112 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 112 has an active surface (e.g., the surface facing upwards in FIG. 3), sometimes called a front-side, and an inactive surface (e.g., the surface facing downwards in FIG. 3), sometimes called a back-side.

Devices 114 may be formed at the front side of the semiconductor substrate 112. The devices 114 may be active devices (e.g., transistors, diodes, or the like), capacitors, resistors, or the like. An inter-layer dielectric (ILD) 116 is formed over the front side of the semiconductor substrate 112. The ILD 116 surrounds and may cover the devices 114. The ILD 116 may include one or more dielectric layers formed of materials such as phosphosilicate glass (PSG), borosilicate glass (BSG), boron-doped phosphosilicate glass (BPSG), undoped silicate glass (USG), or the like.

Conductive plugs 118 extend through the ILD 116 to electrically and physically couple the devices 114. For example, when the devices 114 are transistors, the conductive plugs 118 may couple the gates and source/drain regions of the transistors. The conductive plugs 118 may be formed of tungsten, cobalt, nickel, copper, silver, gold, aluminum, the like, or combinations thereof. An interconnect structure 119 is included over the ILD 116 and the conductive plugs 118. The interconnect structure 119 interconnects the devices 114 to form an integrated circuit. The interconnect structure 119 may be formed by, for example, metallization patterns in dielectric layers on the ILD 116. The metallization patterns include metal lines and vias formed in one or more low-k dielectric layers. The metallization patterns of the interconnect structure 119 are electrically coupled to the devices 114 by the conductive plugs 118.

The die 110 further includes pads 120, such as aluminum pads, to which external connections are made. The pads 120 are on the active side of the die 110, such as in and/or on the interconnect structure 119. One or more passivation films 122 are on the die 110, such as on portions of the interconnect structure 119 and the pads 120. Openings extend through the passivation films 122 to the pads 120. Die connectors 124, such as conductive pillars (formed of a metal such as copper, for example), extend through the openings in the passivation films 122 and are physically and electrically coupled to respective ones of the pads 120. The die connectors 124 may be formed by, for example, plating, or the like. The die connectors 124 electrically couple the respective integrated circuits of the die 110.

Optionally, solder regions (e.g., solder balls or solder bumps) may be disposed on the pads 120. The solder balls may be used to perform chip probe (CP) testing on the die 110. The CP testing may be performed on the die 110 to ascertain whether the die 110 is a known good die (KGD). Thus, only dies 110, which are KGDs, undergo subsequent processing are packaged, and dies, which fail the CP testing, are not packaged. After testing, the solder regions may be removed in subsequent processing steps.

A dielectric layer 126 may be on the front side of the die 110, such as on the passivation films 122 and the die connectors 124. The dielectric layer 126 laterally encapsulates the die connectors 124, and the dielectric layer 126 is laterally coterminous with the die 110. Initially, the dielectric layer 126 may bury the die connectors 124, such that a topmost surface of the dielectric layer 126 is above topmost surfaces of the die connectors 124. In some embodiments where solder regions are disposed on the die connectors 124, the dielectric layer 126 may bury the solder regions as well. Alternatively, the solder regions may be removed prior to forming the dielectric layer 126.

The dielectric layer 126 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 126 may be formed, for example, by spin coating, lamination, chemical vapor deposition (CVD), or the like. In some embodiments, the die connectors 124 are exposed through the dielectric layer 126 during formation of the die 110. In some embodiments, the die connectors 124 remain buried and are exposed during a subsequent process for packaging the die 110. Exposing the die connectors 124 may remove any solder regions that may be present on the die connectors 124.

In some embodiments, the die 110 is a stacked device that includes multiple semiconductor substrates 112. For example, the die 110 may be a memory device such as a hybrid memory cube (HMC) module, a high bandwidth memory (HBM) module, or the like that includes multiple memory dies. In such embodiments, the die 110 includes multiple semiconductor substrates 112 interconnected by through-substrate vias (TSVs). Each of the semiconductor substrates 112 may have an interconnect structure 119.

The adhesive 106 is on back sides of the dies 110 and adheres the dies 110 to release layer 104. The adhesive 106 may be any suitable adhesive, epoxy, die attach film (DAF), or the like. The adhesive 106 may be applied to a back side of the integrated circuit dies 110, such as to a back side of the respective semiconductor wafer or may be applied over the surface of the carrier substrate 100. The dies 110 may be singulated, such as by sawing or dicing, and adhered to the release layer 104 by the adhesive 106 using, for example, a pick-and-place tool.

Figure 4:
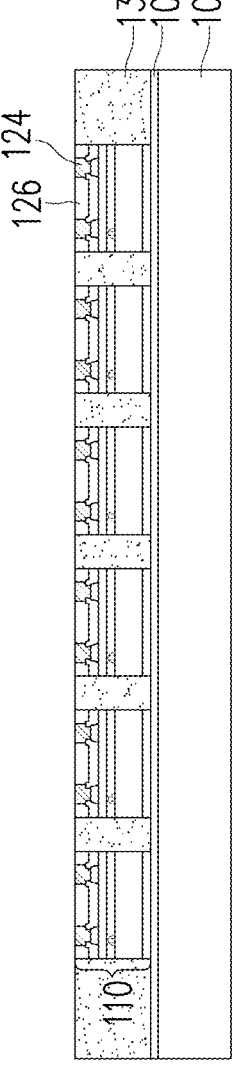

In FIG. 4, an encapsulant 130 is formed on and around the dies 110. After formation, the encapsulant 130 encapsulates the dies 110. The encapsulant 130 may be a molding compound, epoxy, or the like. The encapsulant 130 may be applied by compression molding, transfer molding, or the like, and may be formed over the carrier substrate 102 such that the dies 110 are buried or covered. The encapsulant 130 is further formed in gap regions between the dies 110. The encapsulant 130 may be applied in liquid or semi-liquid form and subsequently cured.

Further in FIG. 4, a planarization process is performed on the encapsulant 130 to expose the die connectors 124 and dielectric layers 126. The planarization process may also remove material of the dielectric layers 126 and/or the die connectors 124 until the die connectors 124 are exposed. Following the planarization process, top surfaces of the, the die connectors 124, the dielectric layers 126, and the encap-sulant 130 may be level with one another (e.g., coplanar). The planarization process may be, for example, a chemical-mechanical polish (CMP) process, a grinding process, an etch-back process, or the like. In some embodiments, the planarization process may be omitted, for example, if the die connectors 124 are already exposed.

In FIGS. 5 through 14, a redistribution structure 156 (see FIG. 14) having a fine-featured portion 152 and a coarse-featured portion 154 is formed over the encapsulant 130 and the dies 110. The redistribution structure 156 includes met-allization patterns, dielectric layers, and under-bump metal-lurgies (UBMs). The metallization patterns may also be referred to as redistribution layers or redistribution lines. The redistribution structure 156 is shown as an example having four layers of metallization patterns. More or fewer dielectric layers and metallization patterns may be formed in the redistribution structure 156. If fewer dielectric layers and metallization patterns are to be formed, steps and process discussed below may be omitted. If more dielectric layers and metallization patterns are to be formed, steps and processes discussed below may be repeated. The fine-featured portion 152 and the coarse-featured portion 154 of the redistribution structure 156 include metallization pat-terns and dielectric layers of differing sizes.

Figure 5:
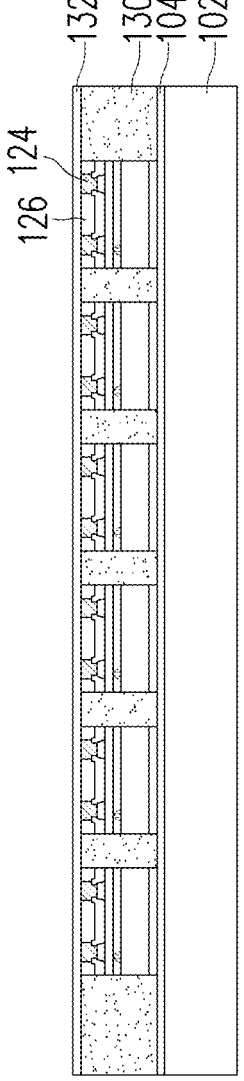

FIGS. 5 through 8 illustrate an example of forming the fine-featured portion 152 of the redistribution structure 156. In FIG. 5, the dielectric layer 132 is deposited on the encapsulant 130, the dielectric layers 126, and the die connectors 124. In some embodiments, the dielectric layer 132 is formed of a photo-sensitive material such as PBO, polyimide, BCB, or the like, which may be patterned using a lithography mask. The dielectric layer 132 may be formed by spin coating, lamination, CVD, the like, or a combination thereof.

Figure 6:
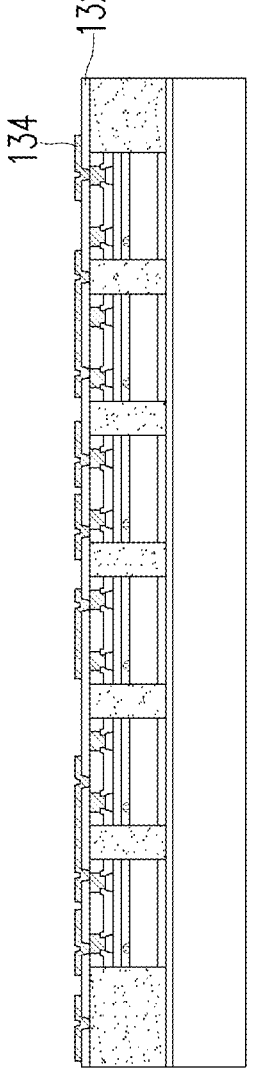

In FIG. 6, the dielectric layer 132 is then patterned and the metallization patterns 134 are formed. The patterning forms openings exposing portions of the die connectors 124. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

The metallization pattern 134 is then formed. The metal-lization pattern 134 has line portions (also referred to as conductive lines or traces) on and extending along the major surface of the dielectric layer 132, and has via portions (also referred to as conductive vias) extending through the dielec-tric layer 132 to physically and electrically couple the die connectors 124 of the integrated circuit dies 405. As an example, the metallization pattern 134 may be formed by forming a seed layer over the dielectric layer 132 and in the openings extending through the dielectric layer 132. In some embodiments, the seed layer is a metal layer, which may be a single layer or a composite layer comprising a plurality of sub-layers formed of different materials. In some embodi-ments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 134. The patterning forms openings through the photoresist to expose the seed layer. A conductive material is then formed in the openings of the photoresist and on the exposed portions of the seed layer. The conductive material may be formed by plating, such as electroplating or elec-troless plating, or the like. The conductive material may comprise a metal, such as copper, titanium, tungsten, alu-minum, or the like. The combination of the conductive material and underlying portions of the seed layer form the metallization pattern 134. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

Figure 7:
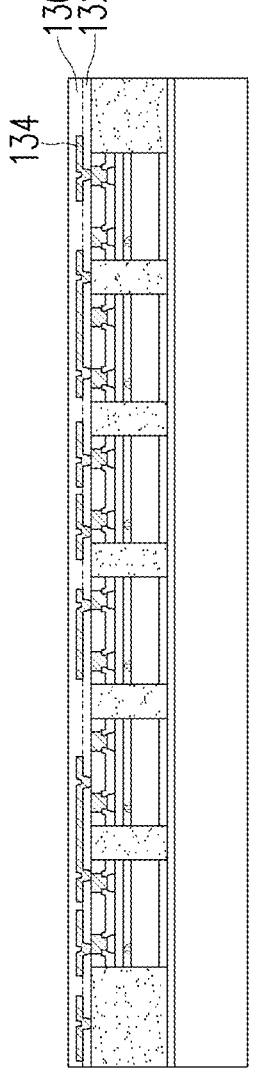

In FIG. 7, the dielectric layer 136 is then deposited on the metallization pattern 134 and the dielectric layer 132. The dielectric layer 136 may be formed in a manner similar to the dielectric layer 132, and may be formed of a material similar to the material of the dielectric layer 132.

Figure 8:
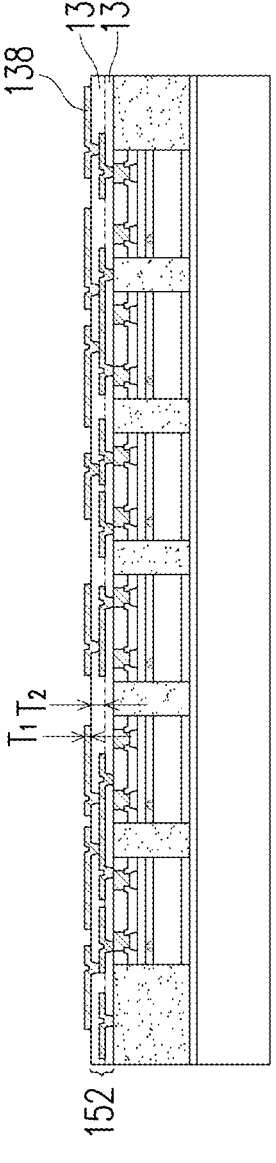

In FIG. 8, the dielectric layer 132 is then patterned and the metallization pattern 138 is formed. The patterning forms openings exposing portions of the metallization pattern 134. The patterning may be by an acceptable process, such as by exposing the dielectric layer 136 to light when the dielectric layer 136 is a photo-sensitive material or by etching using, for example, an anisotropic etch. If the dielectric layer 136 is a photo-sensitive material, the dielectric layer 136 can be developed after the exposure.

The metallization pattern 138 is then formed. The metallization pattern 138 has line portions on and extending along the major surface of the dielectric layer 136, and has via portions extending through the dielectric layer 136 to physically and electrically couple the metallization pattern 134. The metallization pattern 138 may be formed in a manner similar to the metallization pattern 134, and may be formed of a material similar to the material of the metallization pattern 134. Although the fine-featured portion 152 is illustrated as including two dielectric layers and two metallization patterns, any number of dielectric layers and metallization patterns may be formed in the fine-featured portion 152.

The fine-featured portion 152 of the redistribution structure 156 includes dielectric layers 132 and 136; and metallization patterns 134 and 138. In some embodiments, the dielectric layers 132 and 136 are formed from a same dielectric material, and are formed to a same thickness. Likewise, in some embodiments, the conductive features of the metallization patterns 134 and 138 are formed from a same conductive material, and are formed to a same thickness. In particular, the dielectric layers 132 and 136 have a first thickness $T_1$ that is small, such as in the range of about 5 μm to about 40 μm, and the conductive features of the metallization patterns 134 and 138 have a second thickness $T_2$ that is small, such as in the range of about 1 μm to about 25 μm.

Figure 9:
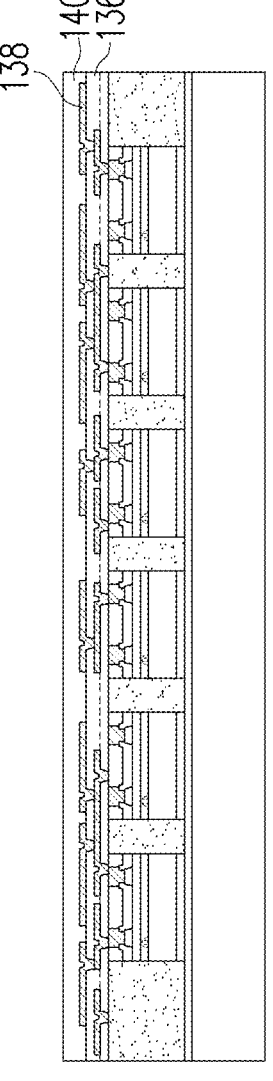

FIGS. 9 through 14 illustrate an example of forming the coarse-featured portion 154 of the redistribution structure 156. In FIG. 9, a dielectric layer 140 may be deposited on the metallization pattern 138 and the dielectric layer 136. The dielectric layer 140 may be formed in a manner similar to the dielectric layer 132, and may be formed of a material similar to the material of the dielectric layer 132.

Figure 10:
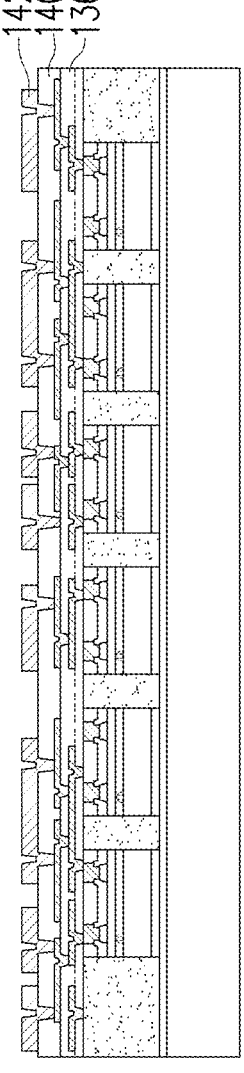

In FIG. 10, the dielectric layer 140 may be patterned and a metallization pattern 142 is then formed. The metallization pattern 142 has line portions on and extending along the major surface of the dielectric layer 140, and has via portions extending through the dielectric layer 140 to physically and electrically couple the metallization pattern 138. The metallization pattern 142 may be formed in a manner similar to the metallization pattern 134, and may be formed of a material similar to the material of the metallization pattern 134.

Figure 11:
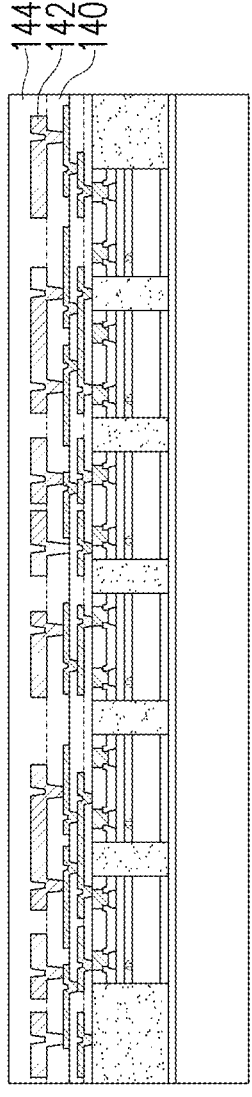

In FIG. 11, a dielectric layer 144 is then deposited on the metallization pattern 142 and the dielectric layer 140. The dielectric layer 144 may be formed in a manner similar to the dielectric layer 132, and may be formed of a material similar to the material of the dielectric layer 132.

Figure 12:
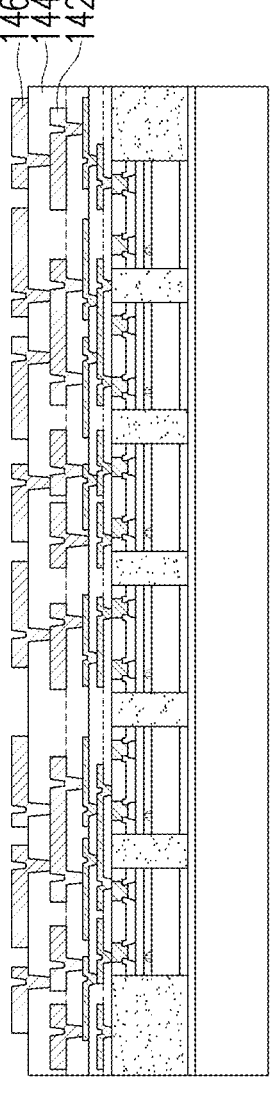

In FIG. 12, the dielectric layer 144 is patterned and a metallization pattern 146 is then formed. The dielectric layer 144 may be patterned in a manner similar to the dielectric layer 132. The metallization pattern 146 has line portions on and extending along the major surface of the dielectric layer 144, and has via portions extending through the dielectric layer 144 to physically and electrically couple the metallization pattern 142. The metallization pattern 146 may be formed in a manner similar to the metallization pattern 134, and may be formed of a material similar to the material of the metallization pattern 134.

Figure 13:
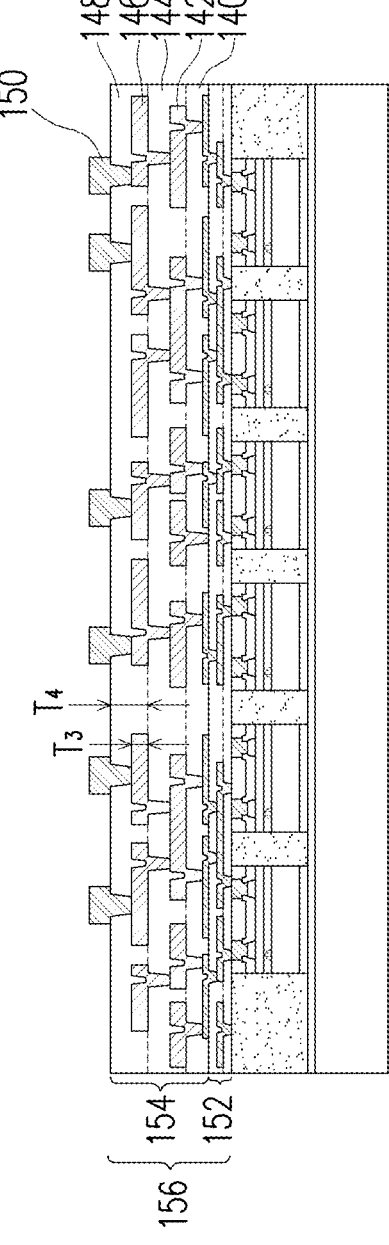

In FIG. 13, a dielectric layer 148 is then deposited on the metallization pattern 146 and the dielectric layer 144. The dielectric layer 148 may be formed in a manner similar to the dielectric layer 132, and may be formed of a material similar to the material of the dielectric layer 132. Although the coarse-featured portion 154 is illustrated as including three dielectric layers and two metallization patterns, any number of dielectric layers and metallization patterns may be formed in the coarse-featured portion 154. In some embodiments, the fine-featured portion 152 and the coarse-featured portion 154 may each include 3 dielectric layers and 3 metallization patterns.

The coarse-featured portion 154 of the redistribution structure 156 includes dielectric layers 140, 144, and 148; and metallization patterns 142 and 146. In some embodiments, the dielectric layers 140, 144, and 148 are formed from a same dielectric material, and are formed to a same thickness. Likewise, in some embodiments, the conductive features of the metallization patterns 142 and 146 are formed from a same conductive material, and are formed to a same thickness. In particular, the dielectric layers 140, 144, and 148 have a third thickness $T_3$ that is large, such as in the range of about 5 μm to about 40 μm, and the conductive features of the metallization patterns 142 and 146 have a fourth thickness $T_4$ that is large, such as in the range of about 1 μm to about 25 μm. In various embodiments, the third thickness $T_3$ may be greater than the first thickness $T_1$ (see FIG. 8), and the fourth thickness $T_4$ may be greater than the second thickness $T_2$ (see FIG. 8).

The coarse-featured portion 154 may have lower resistance compared to the fine-featured portion 152 due to the thickness of the metallization patterns included in the coarse-featured portion 154 and the fine-featured portion 152. The coarse-featured portion 154 may be used to route power lines due to the lower resistance. The fine-featured portion 152 may be used to route signal lines, which do not require the lower resistance. Including both the coarse-featured portion 154 and the fine-featured portion 152 allows for power lines and signal lines to be routed, while minimizing the thickness of the redistribution structure 156.

Figure 14:
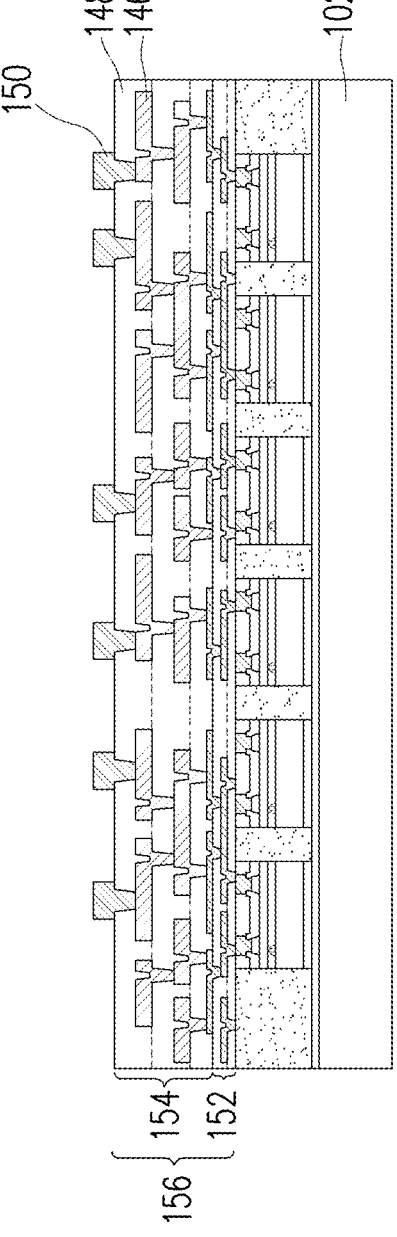

In FIG. 14, pads 150 are formed on dielectric layer 148 and in the openings of the dielectric layer 148 to the metallization pattern 146. The pads 150 are used to couple to conductive connectors 174 and may be referred to as under bump metallurgies (UBMs) 150. The UBMs 150 are formed for external connection to the redistribution structure 156. The UBMs 150 have bump portions on and extending along the major surface of the dielectric layer 148, and have via portions extending through the dielectric layer 148 to physically and electrically couple the metallization pattern 146. As a result, the UBMs 150 are electrically coupled to the integrated circuit dies 405. In some embodiments, the UBMs 150 have a different size than the metallization patterns 134, 138, 142, and 146.

As an example, the UBMs 150 may be formed by first forming a seed layer over the dielectric layer 148 and in the openings extending through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 150. The patterning forms openings through the photoresist to expose the seed layer. A conductive material is then formed in the openings of the photoresist and on the exposed portions of the seed layer.

The conductive material may be formed by plating, such as electroplating or electroless plating, or the like. The conductive material may comprise a metal, like copper, titanium, tungsten, aluminum, or the like. In some embodiments, the UBMs 150 may comprise alloys such as electroless nickel, electroless palladium, immersion gold (ENEPIG), electroless nickel, immersion gold (ENIG), or the like. The combination of the conductive material and underlying portions of the seed layer form the UBMs 150. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

Figure 15:
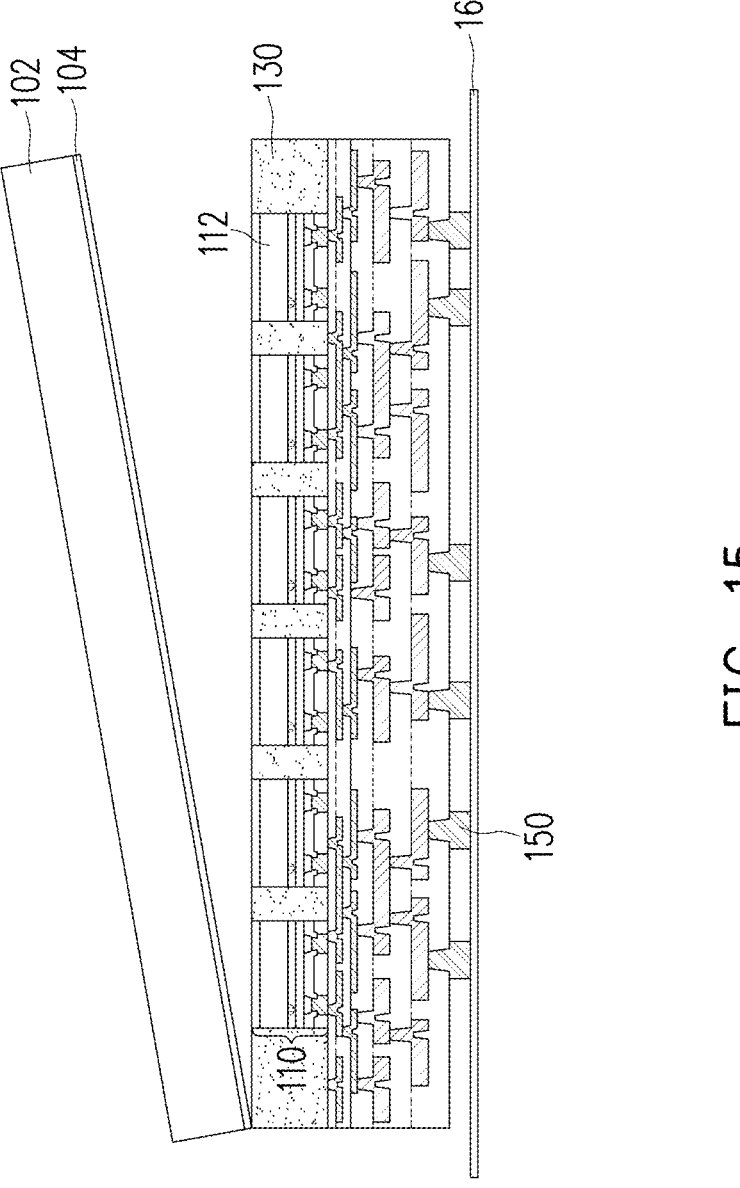

In FIG. 15, the structure of FIG. 13 is flipped, placed on tape 160, and the carrier substrate 102 is de-bonded from the backside of the package structure, e.g., the backsides of the dies 110 and the encapsulant 130. In accordance with some embodiments, the de-bonding includes projecting a light such as a laser light or a UV light on the release layer 104 so that the release layer 104 decomposes under the heat of the light and the carrier substrate 102 can be removed. The structure is then flipped over and placed on the tape 160 (see FIG. 16).

Figure 16:
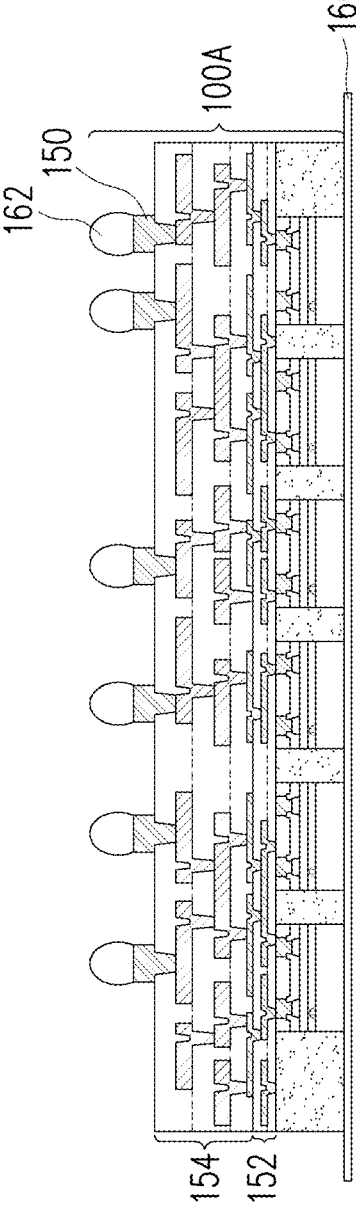

In FIG. 16, conductive connectors 162 are formed on the UBMs 150, forming the package 100A. The conductive connectors 162 may be ball grid array (BGA) connectors, solder balls, metal pillars, controlled collapse chip connection ($C_4$) bumps, micro bumps, electroless nickel-electroless palladium-immersion gold technique (ENEPIG) formed bumps, electroless nickel-immersion gold technique (ENIG) formed bumps or the like. The conductive connectors 162 may include a conductive material such as solder, copper, aluminum, gold, nickel, silver, palladium, tin, the like, or a combination thereof. In some embodiments, the conductive connectors 162 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Figure 17:
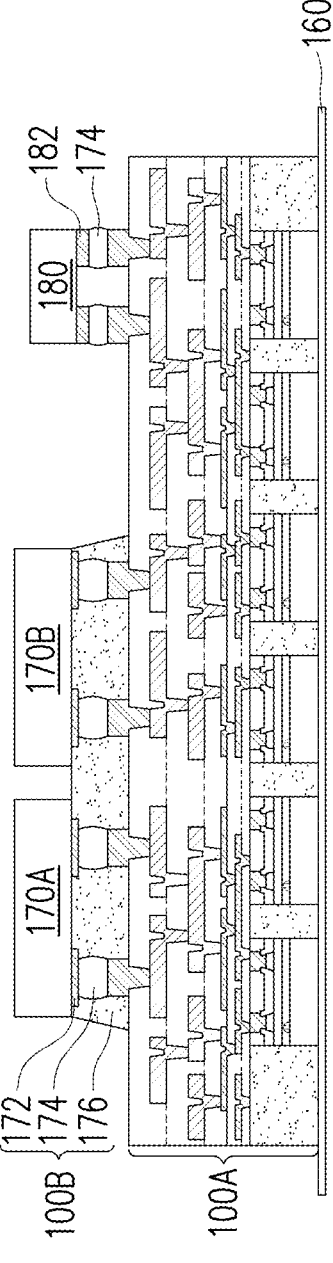
Figure 18:
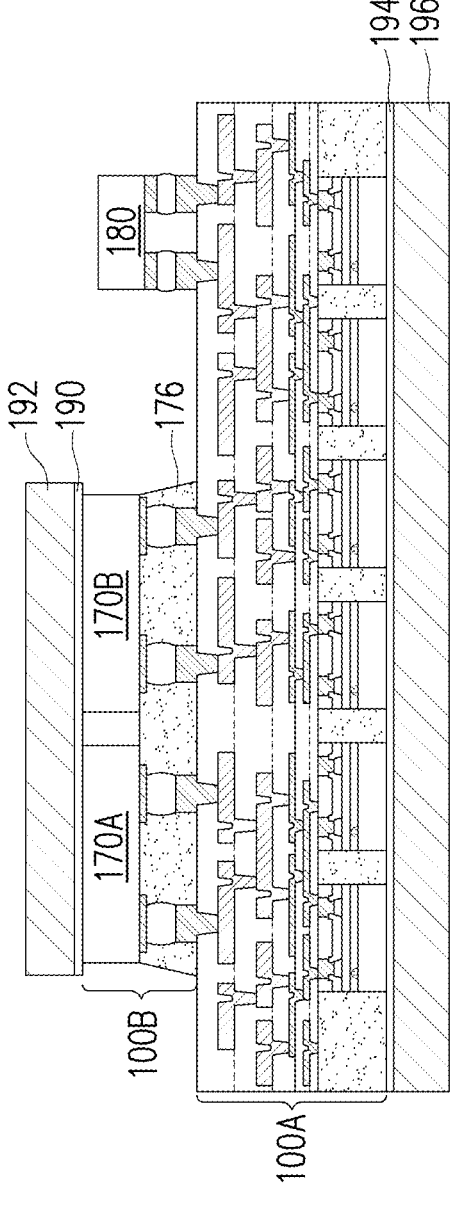
Figure 19:
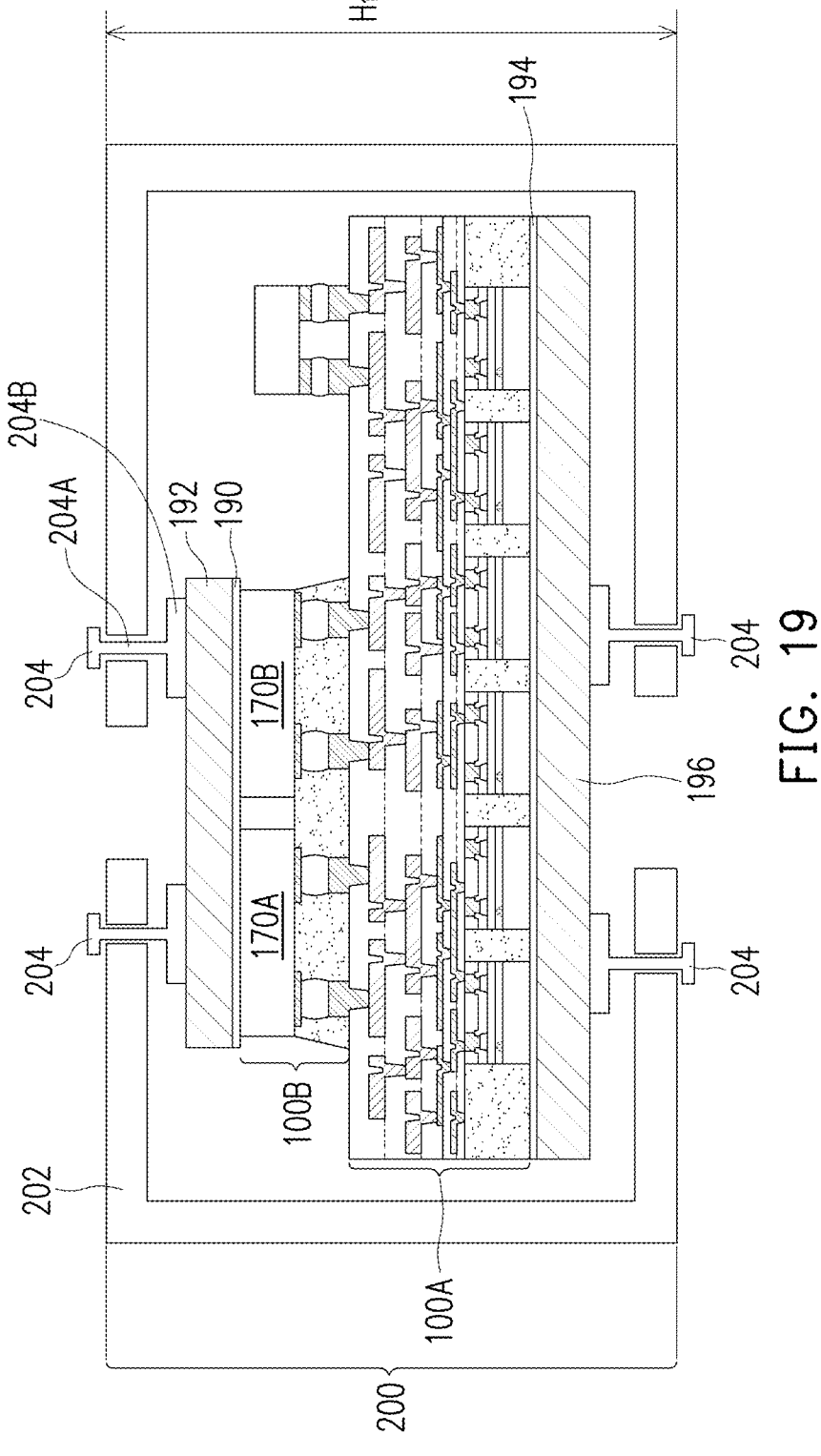

FIGS. 17-19 illustrate cross-sectional views of intermediate steps during a process for forming packaged devices, in accordance with some embodiments.

In FIG. 17, a package 100B, including modules 170 (170A and 170B) are bonded to the package 100A, and an external connector 180 is bonded to the package 100A. The modules 170 may be power supply modules, memory modules, voltage regulator modules, integrated passive device (IPD) modules, the like, or a combination thereof. The modules 170 may be referred to as power modules 170. In some embodiments, the modules 170 may include flip chip bonding, wire bonding, or the like. The modules 170 may be chip-scale packages (CSPs), multi-chip modules (MCMs), or the like. The modules 170 may be packaged circuit board (PCB) modules including discrete integrated circuits and passive device in accordance with some embodiments. In some embodiments, the modules 170 may be formed in a similar way the dies 110 described above.

As illustrated in FIG. 17, the modules 170 may include pads 172 which are coupled to conductive connectors 174. The pads 172 may be formed in a manner similar to the pads 150, and may be formed of a material similar to the material of the pads 150. The modules 170 may be placed using a pick and place machine or the like. Once the modules 170 are placed, the conductive connectors 174 may be reflowed to bond the modules 170 to package 100A.

An underfill 176 may be formed to fill the gaps between the modules 170 and the package 100A. The underfill 176 may be formed by a capillary flow process after the modules 170 are attached, or may be formed by a suitable deposition method before the modules 170 are attached.

In various embodiments, the package 100A may be a super-large fan-out wafer-level package having an area of 10,000 $mm^2$ or greater. The modules 170A and 170B of the package 100B may be placed over the package 100A using a pick and place machine or the like. Once the modules 170A and 170B are placed, the conductive connectors 174 may be reflowed to bond the package 100B to the package 100A. Although FIG. 17 illustrates two modules 170 (170A and 170B) in the package 100B, the package 100B may include more or less modules 170. For example, the package 100B may include four modules 170.

Further, an external connector 180 is attached to the package 100A. The external connector 180 may be an electrical and physical interface for the package 100A to other packages 100A, other external systems, or the like. For example, when the package 100A is installed as part of a larger external system, such as a data center, the external connector 180 may be used to couple the package 100A to the external system. Examples of external connector 180 include large wire bonds, receptors for ribbon cables, flexible printed circuits, or the like. The external connector 180 include pads 182, which may be similar to the UBMs 150. The external connector 180 may include different components, such as a chassis, the pads 182, and external connection pins, which may comprise different materials. The pads 182 and the conductive connectors 174 are used for physical and electrical connection to the package 100A. Attaching the external connector 180 may include placing the external connector 180 on the package 100A using a pick and place machine or the like and then reflowing the conductive connectors 174 to physically and electrically couple the pads 182 and UBMs 150.

In FIG. 18, a thermal module 192 is attached to the package 100B and a thermal module 196 is attached to the package 100A. The thermal module 192 is attached to the modules 170A and 170B and the thermal module 196 is attached to the backsides of the dies 110. The thermal modules 192 and 196 may be heat sinks, heat spreaders, cold plates, the like, or a combination thereof.

Before attaching the thermal module 192 to the package 100B, a thermal interface material (TIM) 190 may be dispensed on the back sides of the modules 170, physically and thermally coupling the thermal module 192 to the package 100B. Before attaching the thermal module 196 to the package 100A, a thermal interface material (TIM) 194 may be dispensed on the back side of the package 100A, physically and thermally coupling the thermal module 196 to the package 100A. In some embodiments, the TIMs 190 and 194 are formed of a film comprising indium, a thermal grease, a thermal sheet, a phase change material, combinations thereof, or the like.

In FIG. 19, a mechanical brace 200 is installed to secure the thermal modules 192 and 196 to the packages 100B and 100A, respectively. The mechanical brace 200 physically engages portions of the thermal modules 192 and 196. Using the mechanical brace 200 to clamp the thermal modules 192 and 196 to the packages 100B and 100A may reduce any warpage in the packages 100B and 100A. In some embodiments, the body 202 of the mechanical brace 200 has a height H1 from a bottommost surface of the body 202 to a topmost surface of the body 202. In some embodiments, the height H1 is in a range from 10 millimeters (mm) to about 100 mm, such as about 15 mm.

The mechanical brace 200 includes a body 202 and fasteners 204 (sometimes referred to as compression parts 204). In the embodiment of FIG. 19, the mechanical brace 200 includes fasteners 204 engaged directly with both the thermal modules 192 and 196. The body 202 of the mechanical brace is a rigid support that may be formed from a material with a high stiffness, such as a metal which may include steel, titanium, cobalt, or the like. The fasteners 204 include a body 204A and a pad 204B. The body 204A of the fastener 204 engages with the body 202 of the mechanical brace 200 to allow the pad 204B of the fastener 204 to apply pressure to the respective thermal module. In some embodiments, the body 204A of the fastener 204 is a threaded bolt to engage with a threaded hole in the body 202 of the mechanical brace 200. In some embodiments, the body 204A engages with the body 202 by a ratcheting mechanism. In other embodiments, the body 204A can engage with the body 202 in any way that allows the pad 204B apply pressure to the respective thermal module.

After the mechanical brace 200 is initially engaged with the thermal modules 192 and 196, the fasteners 204 are tightened, thereby increasing the mechanical force applied to the packages 100A and 100B by the thermal modules 192 and 196. The fasteners 204 are tightened until the thermal modules 192 and 196 exert a desired amount of pressure on the TIMs 190 and 194. In some embodiments, the desired amount of pressure on the TIMs 190 and 194 is greater than 30 pounds per square inch (psi). In some embodiments, the desired amount of pressure on the TIMs 190 and 194 is from about 30 psi to about 80 psi, such as about 40 psi.

Figure 20:
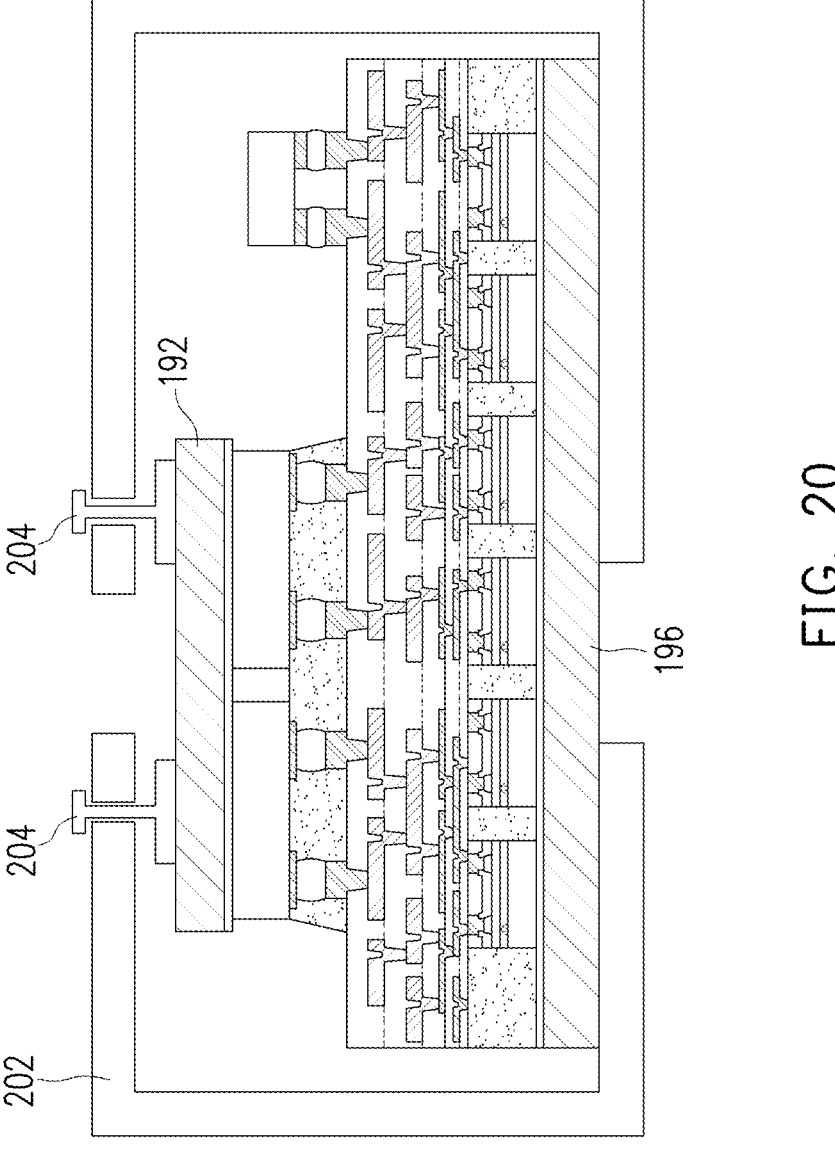
FIG. 20 illustrates a cross-sectional view of intermediate steps during a process for forming packaged devices, in accordance with some embodiments.

FIG. 20 illustrates a cross-sectional view of another packaged device in accordance with some embodiments. The embodiment in FIG. 20 is similar to the embodiment illustrated in FIGS. 1 through 19 except that this embodiment includes does not include the fasteners 204 on the bottom of the package device. Details regarding this embodiment that are similar to those for the previously described embodiment will not be repeated herein.

In this embodiment, the body 202 of the mechanical brace 200 directly contacts the thermal module 196 without any fasteners between the body 202 and the thermal module 196. In other embodiments, the mechanical brace 200 could have fasteners 204 engaged with the thermal module 196 and the fasteners 204 engaged with the thermal module 192 could be omitted. In some embodiments, the device could include fasteners 204 engaged with the top of the packaged device, the bottom of the packaged device, the sidewalls of the package device, or a combination thereof.

Figure 21:
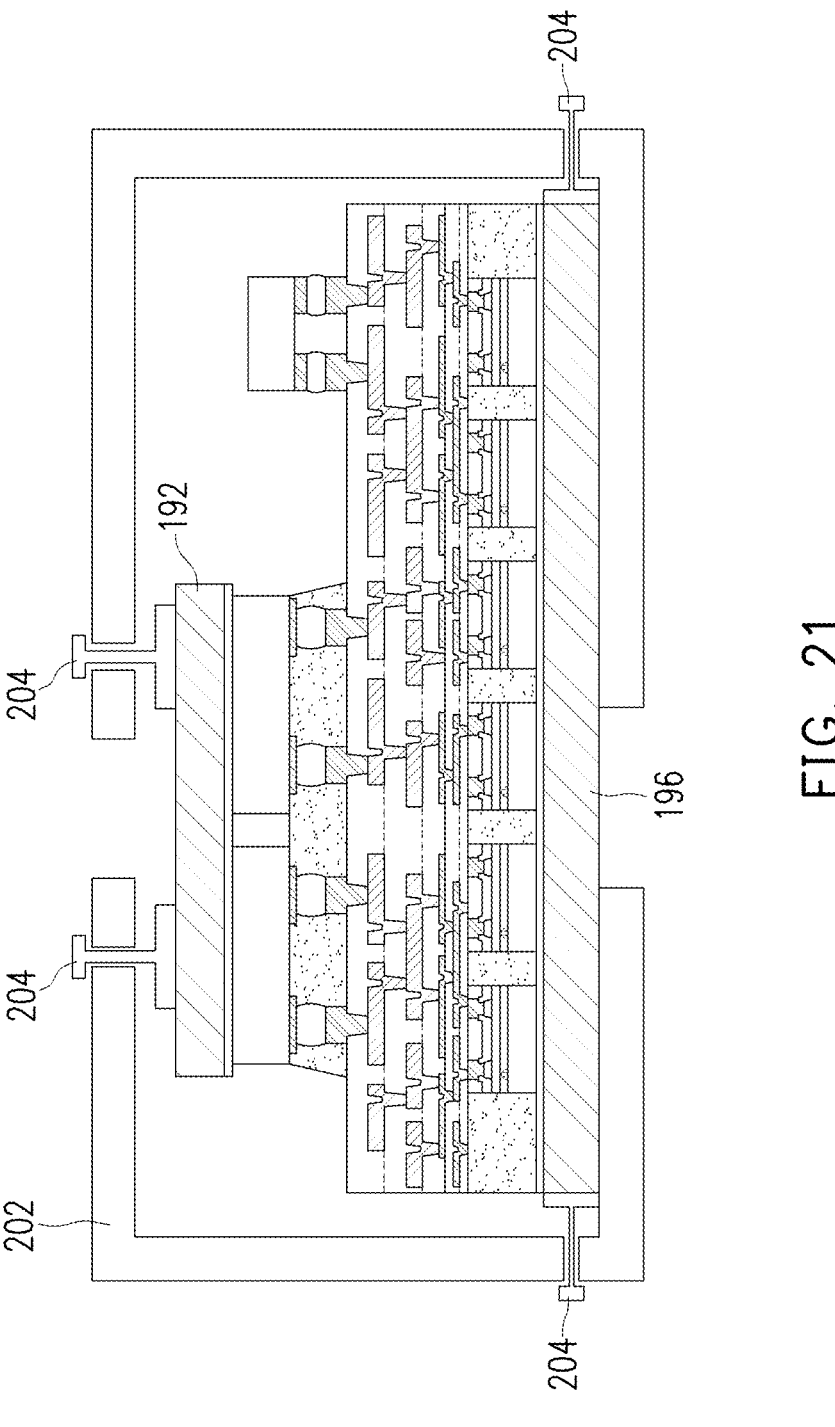
FIG. 21 illustrates a cross-sectional view of intermediate steps during a process for forming packaged devices, in accordance with some embodiments.

FIG. 21 illustrates a cross-sectional view of another packaged device in accordance with some embodiments. The embodiment in FIG. 21 is similar to the embodiment illustrated in FIG. 21 except that this embodiment includes fasteners 204 engaged with the sidewalls of the thermal module 196. In this embodiment, the fasteners 204 of the mechanical brace 200 directly contacts the sidewalls thermal module 196. In some embodiments, the device could include fasteners 204 engaged with the top of the packaged device, the bottom of the packaged device, the sidewalls of the package device, or a combination thereof. Details regarding this embodiment that are similar to those for the previously described embodiment will not be repeated herein.

Figure 22:
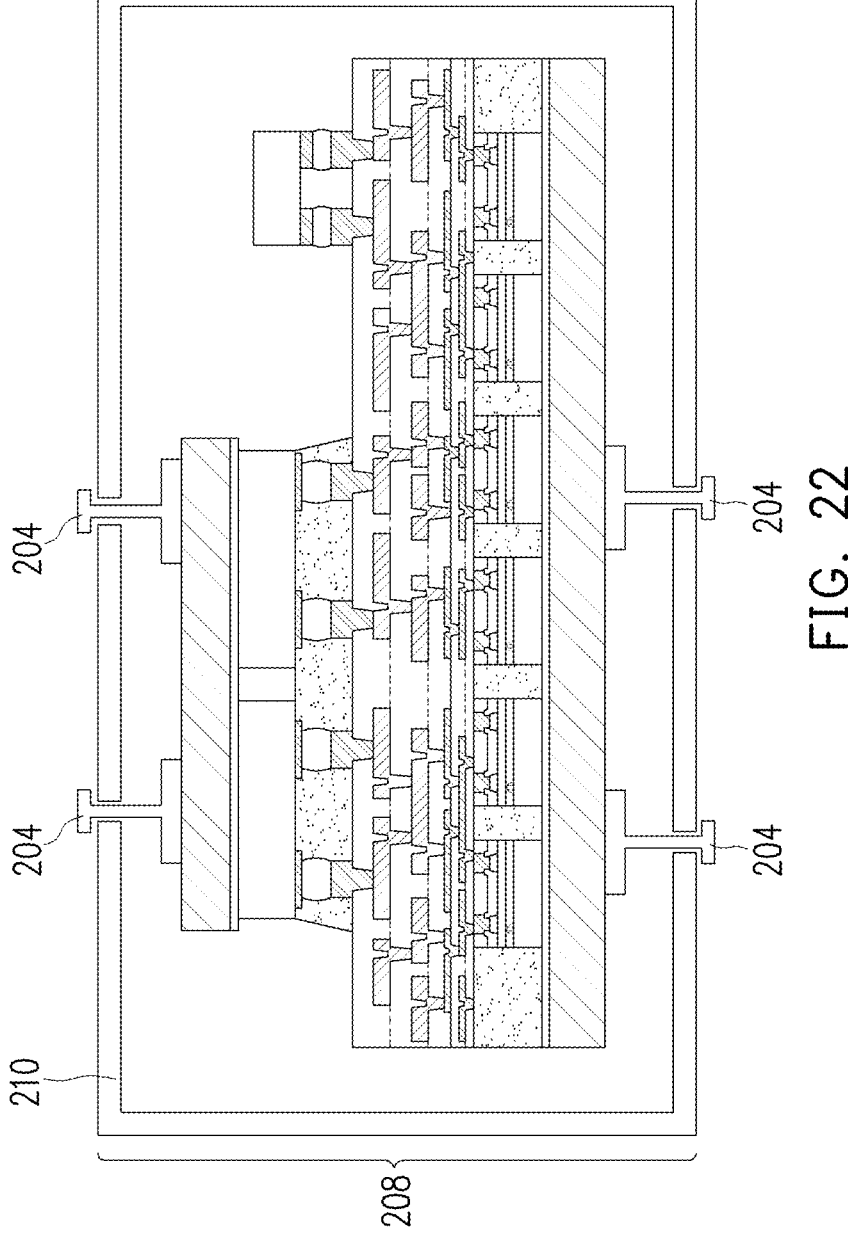
FIG. 22 illustrates a cross-sectional view of intermediate steps during a process for forming packaged devices, in accordance with some embodiments.

FIG. 22 illustrates a cross-sectional view of another packaged device in accordance with some embodiments. The embodiment in FIG. 20 is similar to the embodiment illustrated in FIGS. 1 through 19 except that, in this embodiment, the body of the mechanical brace is integrated into a housing 210 of a system. Details regarding this embodiment that are similar to those for the previously described embodiment will not be repeated herein.

In this embodiment, the housing 210 acts as the body of the mechanical brace 200. In some embodiments, the house 210 could be a server chassis, a server rack, the like, or a combination thereof. In some embodiments, the device could include fasteners 204 engaged with the top of the packaged device, the bottom of the packaged device, the sidewalls of the package device, or a combination thereof.

FIG. 23 illustrates a top-down view of a packaged device, in accordance with some embodiments. This top-down view could apply to any of the embodiments in FIGS. 19-22 described above. In FIG. 23, the packages 100A and 100B and the thermal modules 192 and 196 have circular shapes in the top-down view. In other embodiments, these structures can have any shape in the top-down view, such as a square, rectangular, triangular, other polygons, or the like (see, e.g., FIG. 24).

FIG. 23 illustrates the mechanical brace 200 having three arms on the top of the package device (i.e., the side with the thermal module 192). The mechanical brace 200 can have the same number of arms on the bottom of the package device (i.e., the side with the thermal module 196). In some embodiments, the mechanical brace 200 can have more or less arms. For example, the mechanical brace 200 can have from 2 to 64 arms on each of the top and the bottom of the package device, such as 3 arms or 8 arms on each of the top or bottom.

The thermal module 192 has a diameter $D_1$. The package 100B has a diameter $D_2$. The thermal module 196 has a diameter $D_3$. The arm of the mechanical brace has a length $L_1$. The contact area of a fastener 204 with the thermal modules 192/196 is $A_1$. In some embodiments, the diameter $D_2$ is greater than or equal to the diameter $D_1$. In some embodiments, the diameter $D_2$ is less than or equal to the diameter $D_3$. In some embodiments, the length $L_1$ is in a range from about $\frac{1}{16}D_3$ to about $\frac{1}{2}D_3$. In some embodiments, the contacting area $A_1$ is in a range from about $\frac{1}{128}$ to about $\frac{1}{4}$ of the area of the respective thermal module 192/196.

FIG. 24 illustrates a top-down view of a packaged device, in accordance with some embodiments. This top-down view could apply to any of the embodiments in FIGS. 19-22 described above. The embodiment in FIG. 24 is similar to the embodiment illustrated in FIG. 23 except that, in this embodiment, the packages 100A and 100B and the thermal modules 192 and 196 have square and/or rectangular shapes in the top-down view. Details regarding this embodiment that are similar to those for the previously described embodiment will not be repeated herein.

Figure 25:
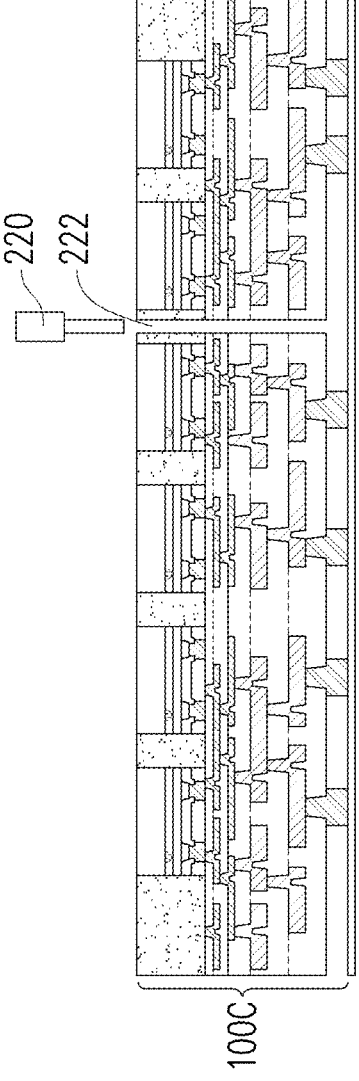
FIGS. 25 and 26 illustrate cross-sectional views of intermediate steps during a process for forming packaged devices, in accordance with some embodiments.
Figure 26:
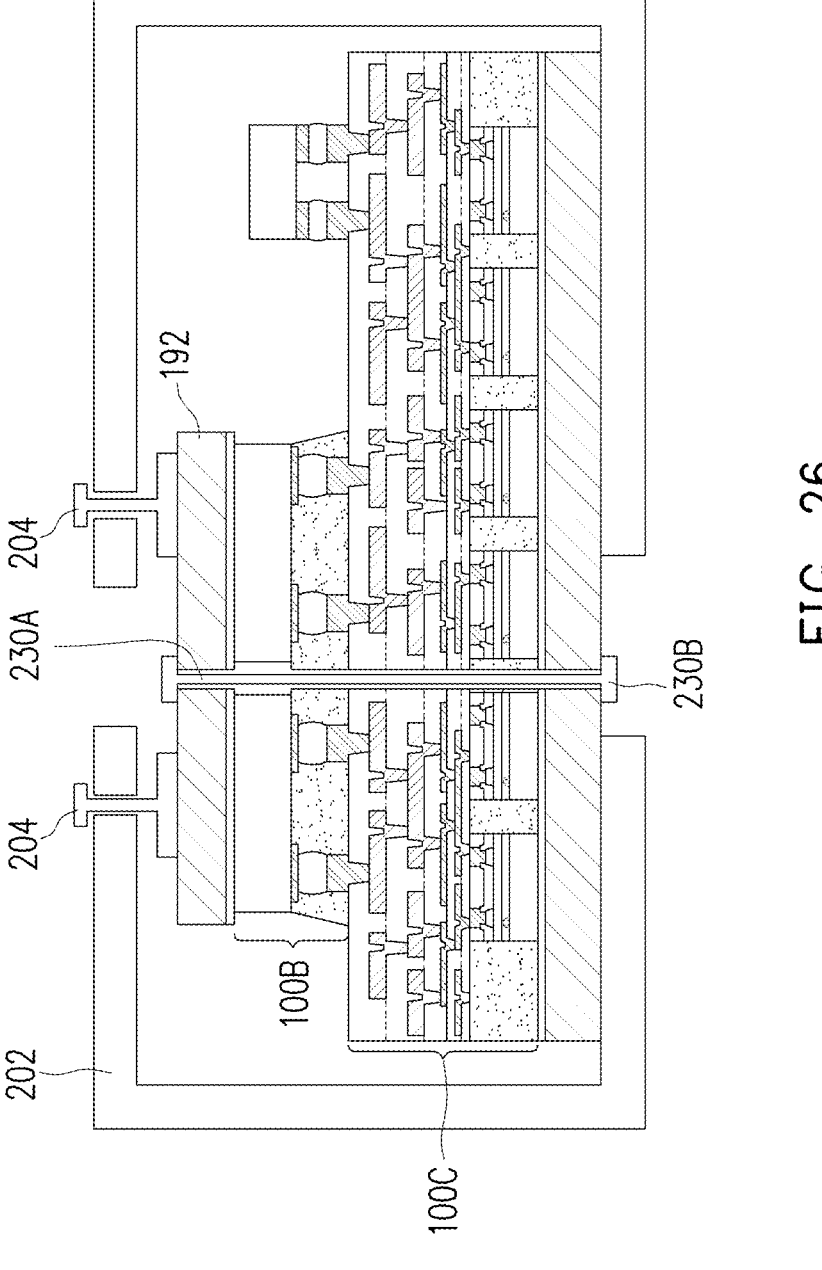
Figure 27:
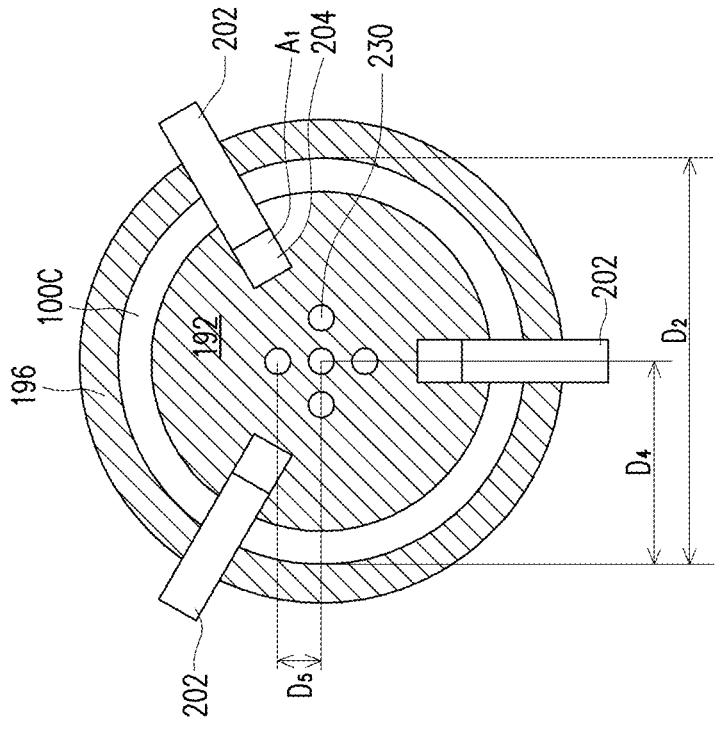

FIGS. 25 through 27 illustrate cross-sectional and top-down views of intermediate steps during a process for forming packaged devices, in accordance with some embodiments. The embodiment in FIGS. 23 through 27 is similar to the embodiments illustrated in FIGS. 1 through 24 except that this embodiment includes bolts 230A extending through the packages 100A and 100B. Details regarding this embodiment that are similar to those for the previously described embodiment will not be repeated herein.

FIG. 25 illustrates an intermediate stage of processing similar to that described in FIG. 25 above and the description of forming this intermediate stage of processing is not repeated herein. In FIG. 25, after the carrier substrate 102 is de-bonded, a hole 222 is formed through the package 100C to allow the bolt 230A to extend through the package 100C.

The hole 222 may be formed by a drilling process 220 such as laser drilling, mechanical drilling, or the like. The hole 222 may be formed by drilling an outline for the holes 222 with the drilling process, and then removing the material separated by the outline.

FIG. 26 illustrates an intermediate stage of processing similar to that described in FIGS. 19 and 20 above and the description of forming this intermediate stage of processing is not repeated herein. In FIG. 26, the bolt 230A extends through the packages 100C and 100B and the fasteners 230B are fastened to the ends of the bolt 230A. The fasteners 230B engage with the bolt 230A and physically contact the thermal modules 192 and 196 to apply pressure to the thermal modules 192/196 and the TIMs 190 and 194. In some embodiments, the fasteners 230B is threaded onto the bolt 230A. In some embodiments, the fasteners 230B engage with the bolt 230A by a ratcheting mechanism. In other embodiments, the fasteners 230B can engage with the bolt 230A in any way that allows the fasteners 230B to apply pressure to the respective thermal modules. Although one bolt 230A is illustrated, there may be from 1 to about 5 bolts in the package device.

FIG. 27 illustrates a top-down view of the packaged device in FIG. 26, in accordance with some embodiments. The embodiment in FIG. 27 is similar to the embodiment illustrated in FIG. 23 except that, in this embodiment, the packaged device includes bolt 230A and fasteners 230B. Details regarding this embodiment that are similar to those for the previously described embodiment will not be repeated herein.

Distance $D_4$ is the distance from the outer edge of the package 100C to the center of the bolt 230A. Distance $D_5$ is the distance between the centers of adjacent bolts 230A. In some embodiments, the distance $D_4$ is in a range from about $\frac{1}{4}D_2$ to about $\frac{1}{2}D_2$. In some embodiments, the distance $D_5$ is in a range from about 0.5 mm to about $\frac{1}{2}D_2$.

Figure 28:
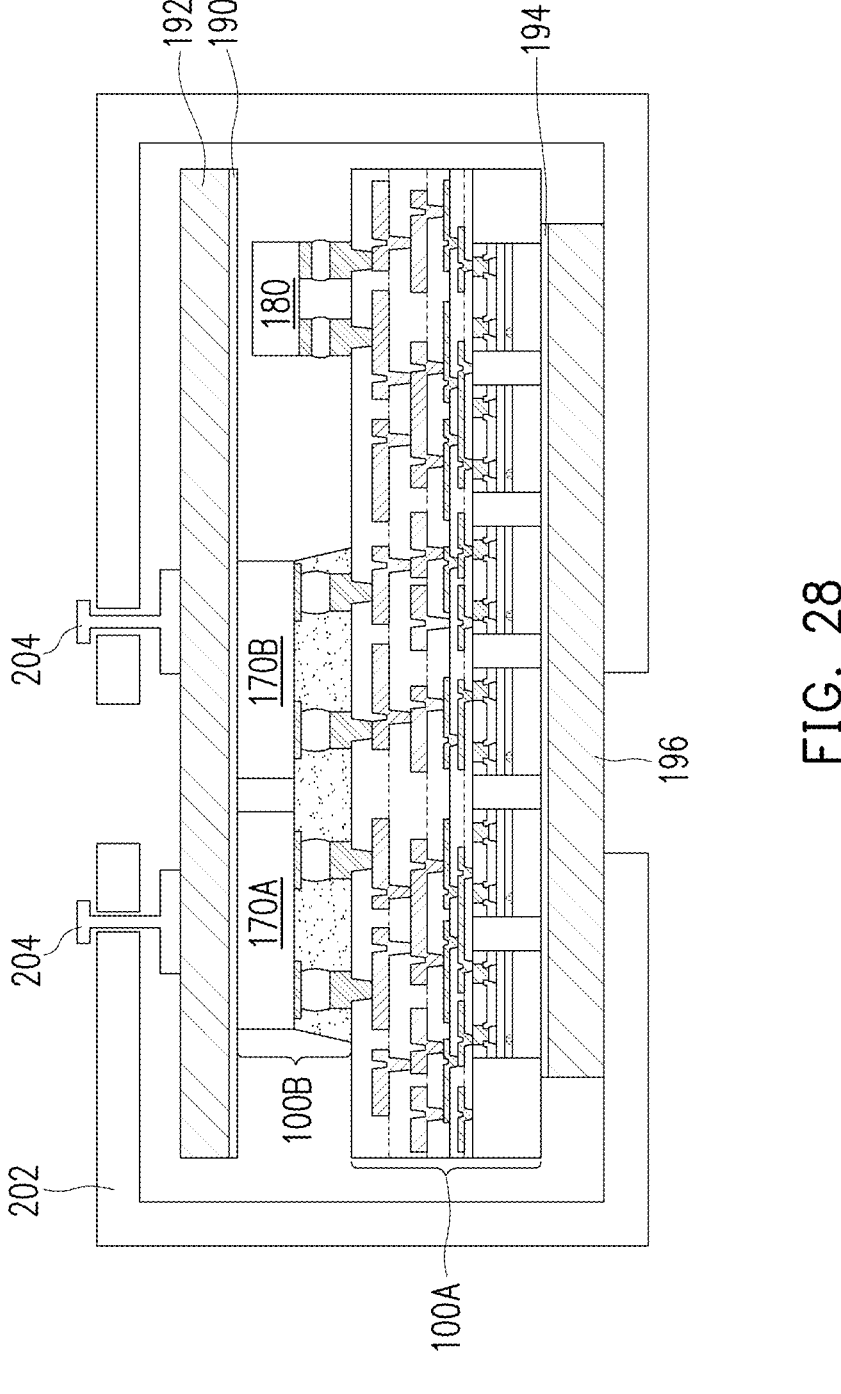
FIG. 28 illustrates a cross-sectional view of a packaged device, in accordance with some embodiments.

FIG. 28 illustrates a cross-sectional view of a packaged device, in accordance with some embodiments. The embodiment in FIG. 28 is similar to the embodiments illustrated in FIGS. 1 through 27 except that in this embodiment, the thermal module 192 has a larger diameter than the thermal module 196. Details regarding this embodiment that are similar to those for the previously described embodiment will not be repeated herein. The configuration of the thermal modules 192 and 196 in this embodiment may be applied to any of the previously disclosed embodiments.

In FIG. 28, the thermal module 192 has a larger diameter than the thermal module 196. As illustrated in FIG. 28, the thermal module 192 is attached to the package 100B and the external connector 180. In some embodiments, the thermal module 192 is only attached to the package 100B. Similar to the previous embodiments, the thermal module 196 is attached to the package 100A.

Embodiments disclosed herein may achieve advantages. For example, some or all of the embodiments described herein may allow for the enhanced TIM pressures while also preventing damage and cost to the InFO (integrated fan-out) wafer from wafer hole drilling and screwing processes. This combination of advantages may increase the reliability of the package after thermal cycling. Further, the disclosed packages can have thermal management systems integrated with a server chassis which can reduce cost and size of the overall systems.

One embodiment includes a first package component including a first integrated circuit die. The device also includes a first encapsulant at least partially surrounding the first integrated circuit die. The device also includes a redistribution structure on the first encapsulant and coupled to the first integrated circuit die. The device also includes a first thermal module coupled to the first integrated circuit die. The device also includes a second package component bonded to the first package component, the second package component including a power module attached to the first package component, the power module including active devices. The device also includes a second thermal module coupled to the power module. The device also includes a mechanical brace extending from a top surface of the second thermal module to a bottom surface of the first thermal module, the mechanical brace physically contacting the first thermal module and the second thermal module.

Implementations may include one or more of the following features. The device where the mechanical brace includes a body, a first compression part extending through the body and physically contacting the first thermal module, and a second compression part extending through the body and physically contacting the second thermal module. The body of the mechanical brace extends adjacent opposite sides of the first package component and the second package component. The body of the mechanical brace is integrated into a system housing. The device further including a first thermal interface material disposed between the first thermal module and the first integrated circuit die, and a second thermal interface material disposed between the second thermal module and the power module. The mechanical brace is configured to apply a pressure of greater than 30 pounds per square inch to the first thermal interface material. The power module includes a power supply module, a memory module, a voltage regulator module, an integrated passive device (IPD) module, or a combination thereof. The first thermal module includes a heat sink, a heat spreader, a cold plate, or a combination thereof. The device further including a first bolt extending through the first package component and the second package component a first fastener threaded onto a first end of the first bolt, the first fastener physically contacting the first thermal module and a second fastener threaded onto a second end of the first bolt, the second fastener physically contacting the second thermal module. The second distance is in a range from of the first diameter to of the first diameter.

One embodiment includes a first package including a plurality of integrated circuit dies. The device also includes a first power module and a second power module over and bonded to the first package. The device also includes a first thermal interface material (TIM) below and coupled to the plurality of integrated circuit dies of the first package. The device also includes a first thermal module below and coupled to the first TIM. The device also includes a second TIM over and coupled to the first power module and the second power module. The device also includes a second thermal module over and couple to the second TIM. The device also includes a mechanical brace including a body, a first fastener, and a second fastener, the body including a first portion extending below the first thermal module, a second portion extending along a side of the first package, and a third portion extending over the second thermal module, the first, second, and third portions being continuous, the first fastener extending through the first portion of the body of the mechanical brace and being coupled to the first thermal module, the second fastener extending through the third portion of the body of the mechanical brace and being coupled to the second thermal module.

Implementations may include one or more of the following features. The device where the first fastener is threaded through the first portion of the body of the mechanical brace. The first fastener, the second fastener, and the body of the mechanical brace are configured to apply a pressure of greater than 30 pounds per square inch to the first TIM and the second TIM. The first package has a circular shape in top-down view. The first thermal interface material includes a film including indium, a thermal grease, a thermal sheet, a phase change material, or a combination thereof. The first package further includes a first encapsulant at least partially surrounding the plurality of integrated circuit dies and a redistribution structure on the first encapsulant and coupled to the plurality of integrated circuit dies, the first and second power modules being bonded to the redistribution structure.

One embodiment includes forming a first package component, where forming the first package component includes encapsulating a first integrated circuit die with an encapsulant. The method also includes forming a redistribution structure on the encapsulant and an active side of the first integrated circuit die. The method also includes bonding a power module to the redistribution structure of the first package component, the power module including active devices. The method also includes forming a first thermal interface material (TIM) on a backside of the first integrated circuit die and on a surface of the encapsulant. The method also includes attaching a first thermal module coupled to the first TIM. The method also includes forming a second TIM on a backside of the power module. The method also includes attaching a second thermal module to the second TIM. The method also includes attaching a mechanical brace to the first thermal module and the second thermal module, the mechanical brace including compression parts and a body, the body of the mechanical brace extending from a top surface of the second thermal module to a bottom surface of the first thermal module, the mechanical brace physically contacting the first thermal module and the second thermal module. The method also includes adjusting the compression parts of the mechanical brace to increase a pressure on the first TIM and the second TIM.

Implementations may include one or more of the following features. The method where the compression parts of the mechanical brace are adjusted to apply a pressure of greater than 30 pounds per square inch to the first TIM and the second TIM. The method further including forming a hole through the first package component disposing a bolt through the first package component and adjacent the power module attaching a first fastener onto a first end of the bolt, the first fastener physically contacting the first thermal module and attaching a second fastener onto a second end of the bolt, the second fastener physically contacting the second thermal module. The body of the mechanical brace is integrated into a system housing.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a package component having an integrated circuit die encapsulated by an encapsulant;
   a redistribution structure on the encapsulant, the redistribution structure comprising a first layer with a first pitch and
      a second layer with a second pitch, the second pitch being larger than the first pitch;
   a first thermal module coupled to the package component; and
   a housing extending over the first thermal module and configured to apply a compressive force on the first thermal module towards the package component.

2. The device of claim 1, wherein the first thermal module is coupled to the integrated circuit die with a thermal interface material.

3. The device of claim 1, wherein the first pitch is in a range of 1-25 μm and the second pitch is in a range of 5-40 μm.

4. The device of claim 1, further comprising a power module bonded to the redistribution structure.

5. The device of claim 4, further comprising a second thermal module coupled to the power module.

6. The device of claim 5, wherein the housing extends over the first and second thermal modules and is configured to apply a compressive force on the first and second thermal modules.

7. The device of claim 1, wherein the package component has a circular shape in a top-down view.

8. The device of claim 1, wherein the housing is a server chassis or a server rack.

9. A packaged system comprising:
   a first integrated circuit package having a first plurality of integrated circuit dies encapsulated by a first encapsulant;
   a second integrated circuit package bonded to the first integrated circuit package, the second integrated circuit package having a second plurality of integrated circuit dies;
   a cold plate coupled to a top side of the second integrated circuit package with a first thermal interface material; and
   a heat spreader coupled to a bottom side of the first integrated circuit package with a second thermal interface material.

10. The packaged system of claim 9, wherein the first and second thermal interface materials each comprise indium, a thermal grease, a thermal sheet, a phase change material, or a combination thereof.

11. The packaged system of claim 9, wherein the first integrated circuit package comprises a redistribution structure on the first encapsulant, and wherein the second integrated circuit package is bonded to the redistribution structure.

12. The packaged system of claim 11, wherein the redistribution structure comprises a first routing layer having a first line spacing and a second routing layer having a second line spacing larger than the first line spacing.

13. The packaged system of claim 9, further comprising a housing extending over the cold plate and the heat spreader and configured to apply a compressive force to the cold plate and the heat spreader.

14. A semiconductor package assembly comprising:

a first package substrate having a plurality of integrated circuits embedded in a molding material;

a second package substrate mounted above the first package substrate, the second package substrate comprising multiple semiconductor dies;

a thermal dissipation element thermally coupled to an upper surface of the second package substrate through a first thermal interface layer; and a thermal spreader element thermally coupled to a lower surface of the first package substrate through a second thermal interface layer, wherein the thermal spreader element has a larger surface area than the first package substrate.

15. The semiconductor package assembly of claim 14, wherein the first and second thermal interface layers comprise at least one of: indium, thermal grease, a thermal pad, or a phase change material.

16. The semiconductor package assembly of claim 14, wherein the first package substrate includes a redistribution structure formed over the molding material, and wherein the second package substrate is electrically connected to the redistribution structure.

17. The semiconductor package assembly of claim 16, wherein the redistribution structure comprises a first routing layer having a first minimum line pitch and a second routing layer having a second minimum line pitch greater than the first minimum line pitch.

18. The semiconductor package assembly of claim 14, further comprising a chassis structure extending over both the thermal dissipation element and the thermal spreader element, wherein the chassis structure is configured to apply compressive force to maintain thermal contact.

19. The semiconductor package assembly of claim 14, wherein the thermal dissipation element comprises a cold plate having internal fluid channels.

20. The semiconductor package assembly of claim 14, wherein the multiple semiconductor dies of the second package substrate are arranged in a two-dimensional array.

\* \* \* \* \*